United States Patent [19]
Possin et al.

[11] Patent Number: 5,010,027

[45] Date of Patent: Apr. 23, 1991

[54] METHOD FOR FABRICATING A SELF-ALIGNED THIN-FILM TRANSISTOR UTILIZING PLANARIZATION AND BACK-SIDE PHOTORESIST EXPOSURE

[75] Inventors: George E. Possin; Wei Ching-Yeu, both of Schenectady, N.Y.

[73] Assignee: General Electric Company, Schenectady, N.Y.

[21] Appl. No.: 499,733

[22] Filed: Mar. 21, 1990

[51] Int. Cl.$^5$ .................. H01L 29/78; H01L 21/00
[52] U.S. Cl. ................................. 437/41; 437/101; 437/187; 357/23.7
[58] Field of Search ............... 437/41, 101, 235, 238, 437/241, 43, 44, 187; 357/2, 4, 23.7

[56] References Cited

U.S. PATENT DOCUMENTS

| | | | |
|---|---|---|---|
| 4,587,720 | 5/1986 | Chenevas-Paule et al. | 437/41 |
| 4,678,542 | 7/1987 | Boer et al. | 357/4 |
| 4,686,553 | 8/1987 | Possin | 357/23.7 |
| 4,715,930 | 12/1987 | Diem | 437/101 |
| 4,778,773 | 10/1988 | Sukegawa | 437/41 |
| 4,862,234 | 8/1989 | Koden | 357/23.7 |
| 4,905,066 | 2/1990 | Dohjo et al. | 357/23.7 |
| 4,924,279 | 5/1990 | Shimbo | 357/23.7 |
| 4,935,792 | 6/1990 | Tanaka et al. | 357/23.7 |

FOREIGN PATENT DOCUMENTS

| | | | |
|---|---|---|---|
| 0090661 | 10/1983 | European Pat. Off. | |
| 0139585 | 5/1985 | European Pat. Off. | 437/41 |
| 0152172 | 7/1987 | Japan . | |
| 0239579 | 10/1987 | Japan | 437/41 |
| 0241377 | 10/1987 | Japan | 437/41 |
| 0168052 | 7/1988 | Japan | 357/23.7 |
| 0011368 | 1/1989 | Japan | 437/41 |

OTHER PUBLICATIONS

K. Asama et al., "A Self-Alignment Processed a-Si TFT Matrix Circuit for LCD Panels", Fujitsu Laboratories, Ltd., Atsugi, Japan, pp. 144-145 & 281-285, SID Digest, 1983.

B. Diem et al., "a-Si:H TFT: Potential Suitabilities for Gate and Source-Drain Self-Aligned Structure", pp. 281-285, Mat. Res. Symp. Proc., vol. 33 (1984).

G. E. Possin et al., "Contact-Limited Behavior in Amorphous-Silicon FET for Applications to Matrix--Addressed Liquid-Crystal Displays", pp. 183-189, Proceedings of the SID, vol. 26/3, 1985.

Primary Examiner—Olik Chaudhuri
Assistant Examiner—M. Wilczewski
Attorney, Agent, or Firm—Marvin Snyder; James C. Davis, Jr.

[57] ABSTRACT

A method for fabricating self-aligned thin-film transistors (TFTs) includes the steps of: exposing a backside substrate surface, opposite to a principal substrate surface, to ultra-violet (UV) light to cause exposure of at least a photoresist layer portion which corresponds substantially to an area outside the shadow of a gate electrode formed on the principal substrate surface; developing the exposed photoresist portion to form a mask; etching a second insulation layer segment, using the mask, to form a remaining insulation layer segment, which is aligned with the gate electrode, and narrower than the gate electrode by a selected overlap distance, on each side thereof; and forming source and drain electrodes on a doped semiconductor layer which each overlap the gate electrode by the selected overlap distance. The overlap distance is a function of the UV exposure time, the photoresist development time and the etch time of the second insulation layer.

23 Claims, 6 Drawing Sheets

METHOD FOR FABRICATING A SELF-ALIGNED THIN-FILM TRANSISTOR UTILIZING PLANARIZATION AND BACK-SIDE PHOTORESIST EXPOSURE

BACKGROUND OF THE INVENTION

The present invention relates to thin-film field-effect transistors and, more particularly, to a novel method for fabricating a self-aligned thin-film field-effect transistor (FET) on a transparent substrate, such as glass and the like.

A conventional thin-film field-effect transistor (FET) which is fabricated without using a self-alignment technique can result in a transistor structure with the source and drain electrodes misaligned relative to the gate electrode, i.e., the source electrode, the drain electrode or both can overlap the gate electrode either an excessive distance or too short a distance and cause adverse device performance. An overlap that is excessive causes a large source/drain-to-gate (S/D-G) capacitance and the larger S/D-G capacitance causes higher transistor noise and lag in imager-type devices using thin-film FETs as switching elements. Increased S/D-G capacitance may also contribute to offset-voltage errors in liquid crystal display (LCD) devices when individual picture elements (pixels) are switched between an operative and an inoperative state; the charge that remains in the S/D-G capacitance when the pixel is turned-off may have to be compensated to actually switch the pixel to the inoperative state. The compensating voltage required will be determined by the S/D-G capacitance and may vary from one pixel to another in a LCD device if the S/D-G capacitance varies.

Typically, the S/D-G overlap is designed to be larger than necessary to allow for photolithographic alignment errors and to ensure a sufficiently adequate overlap width to provide an acceptable contact or on-resistance. A S/D-G overlap width shorter than an optimum value may also cause the saturation drain current of the FET to fluctuate outside of acceptable limits. Thus, it is desirable to control the overlap between the S/D electrodes and the gate electrode to an optimum width that is neither too long nor too short.

It is accordingly a primary object of the present invention to provide a novel method for fabricating a self-aligned thin-film transistor which is not subject to the foregoing disadvantages.

It is another object of the present invention to provide a novel method for fabricating a self-aligned thin-film transistor which controls the overlap width of the gate electrode with each of the source and drain electrodes to an optimum distance.

These and other objects of the invention, together with features and advantages thereof, will become apparent from the following detailed specification when read with the accompanying drawings in which like reference numerals refer to like elements.

SUMMARY OF THE INVENTION

In accordance with the invention, a method for fabricating self-aligned thin-film transistors (TFTs) includes the steps of: forming an opaque gate electrode on a principal surface of a transparent substrate; depositing a first layer of insulation material (such as silicon nitride ($SiN_x$), silicon oxide ($SiO_x$) and the like) on the principal substrate surface and over the gate electrode; depositing a layer of semiconductor material on the first insulation layer; depositing a second layer of insulation material on the semiconductor layer; depositing a layer of photoresist on the second insulation layer; exposing a back-side substrate surface, opposite to the principal substrate surface, to ultra-violet (UV) light for a selected duration, to cause exposure of at least a portion of the photoresist, corresponding substantially to an area outside of the gate electrode shadow; removing at least the exposed photoresist to leave a remaining photoresist portion and to expose a segment of the second insulation layer which is not covered by the remaining photoresist portion; selectively etching the second insulation layer segment, to leave a remaining second insulation layer segment, under the remaining photoresist portion, and to expose a portion of the semiconductor layer not covered by the remaining second insulation segment, and with the remaining second insulation segment aligned with the gate electrode and narrower than the gate electrode by a selected overlap distance on each side thereof; removing the remaining photoresist portion; depositing a layer of doped semiconductor material on the exposed semiconductor portion and over the remaining second insulation segment; depositing a layer of conductive material on the doped semiconductor material; depositing a planarization layer of photoresist or the like on the conductive layer; non-selectively etching the planarization layer, to form a via opening therein and to expose at least a portion of a top surface of the conductive layer through the via opening; and selectively etching the exposed conductive layer portion and the doped semiconductor layer using the etched planarization layer as a mask, to form self-registered source and drain electrodes from the etched conductive layer, which each overlap the gate electrode the selected overlap distance.

The selected distance may be controlled by the following process variables, either individually or in any combination: the intensity and duration of the UV exposure of the photoresist during the back-side exposing step; overdevelopment of the photoresist when the exposed photoresist is removed to leave the remaining photoresist portion; and/or over-etching the second insulation layer segment, to undercut the remaining photoresist portion and to reduce the width of the remaining second insulation layer segment.

In an alternate embodiment, the exposed semiconductor portion may be patterned before depositing the doped semiconductor layer, or the doped semiconductor layer may be deposited, and then both the exposed semiconductor portion and doped semiconductor layer can be patterned in the same mask operation, to minimize the area of semiconductor material under the conductive layer and to provide additional area on the substrate for other components, such as pixel electrodes and the like.

DETAILED DESCRIPTION OF THE PREFERRED EMBODIMENTS

Figure 1A:
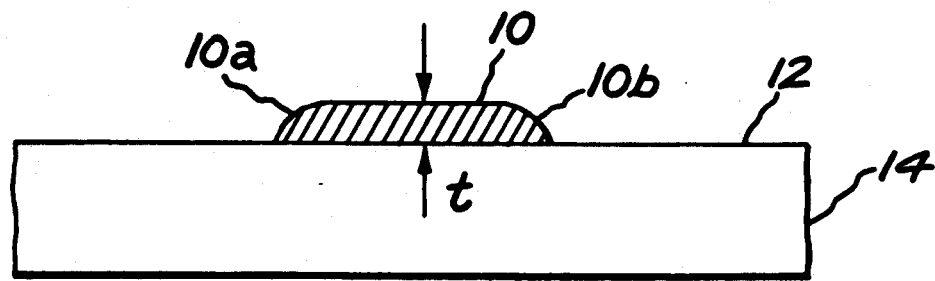
FIGS. 1A–1G are cross-sectional, side elevation views of the steps employed in the thin-film transistor (TFT) fabrication method in accordance with one embodiment of the present invention.

Referring initially to FIG. 1A, a gate electrode 10 is formed on a principal surface 12 of a substrate 14, formed of an insulative transparent material, such as glass and the like. The gate electrode may be a single conductive layer of a metal, such as titanium (Ti), chromium (Cr), tungsten (W), aluminum (Al) and the like, or the gate electrode may be a multilayer structure, such as titanium over molybdenum (Ti/Mo), titanium over aluminum (Ti/Al), chromium over aluminum (Cr/Al), chromium over molybdenum (Cr/Mo) and the like, to provide good adhesion to substrate 14 and low electrical resistance. The side edges 10a and 10b of gate electrode 10 are preferably tapered by known wet or dry etching techniques to improve the step coverage, over the gate electrode edges, of subsequently deposited layers of material. Gate electrode 10 preferably has a thickness "t" between about 100 nm and about 500 nm.

A first layer 16 of insulation material having a thickness of about 200 nm to about 600 nm is deposited on principal substrate surface 12 and over gate electrode 10(FIG. 1B); a layer 18 of semiconductor material, such as intrinsic amorphous silicon (i-Si), amorphous germanium (aGe), polycrystalline semiconductor material or the like, is deposited on first insulation layer 16 to a thickness of about 50 nm by a known technique, such as plasma enhanced chemical vapor deposition (PECVD) and the like. A second insulation layer 20 having a thickness of about 200 nm to about 600 nm is deposited over semiconductor layer 18. The first and second insulation layer may be formed of one or more layers of a silicon nitride ($SiN_x$), a silicon oxide ($SiO_x$), a silicon nitrate ($SiN_xO_y$) or other suitable dielectric material deposited by known techniques, such as PECVD and the like.

Figure 1B:
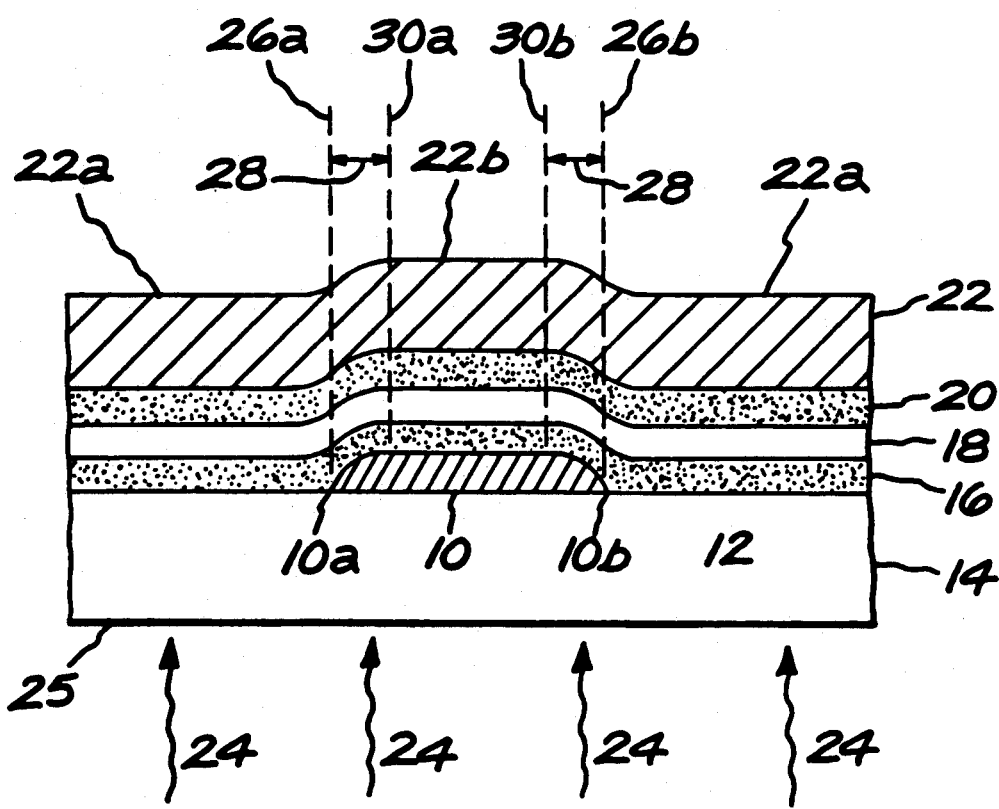

In accordance with the present invention, as seen in FIG. 1B, a layer of positive photoresist material 22 is deposited over second insulation layer 20. Ultra-violet (UV) radiation (indicated by arrows 24) is applied to the backside surface 25 of substrate 14, opposite to principal substrate surface 12, and passes through substrate 14 and layers 16,18 and 20 to expose a portion 22a of the photoresist corresponding substantially to an area (indicated by broken lines 26a and 26b in FIG. 1B) outside of the gate electrode edges. The photoresist portion 22b between broken lines 26a and 26b is effectively within the shadow of gate electrode 10 and does not receive much UV exposure, depending upon the exposure time. The back-side UV exposure occurs for a selected duration to cause overexposure of photoresist layer 22, so that photoresist portion 22b will be exposed a selected distance 28 within each of gate electrode edges 10a and 10b, bounded respectively by broken line pairs 26a and 30a, and 26b and 30b.

Figure 1C:
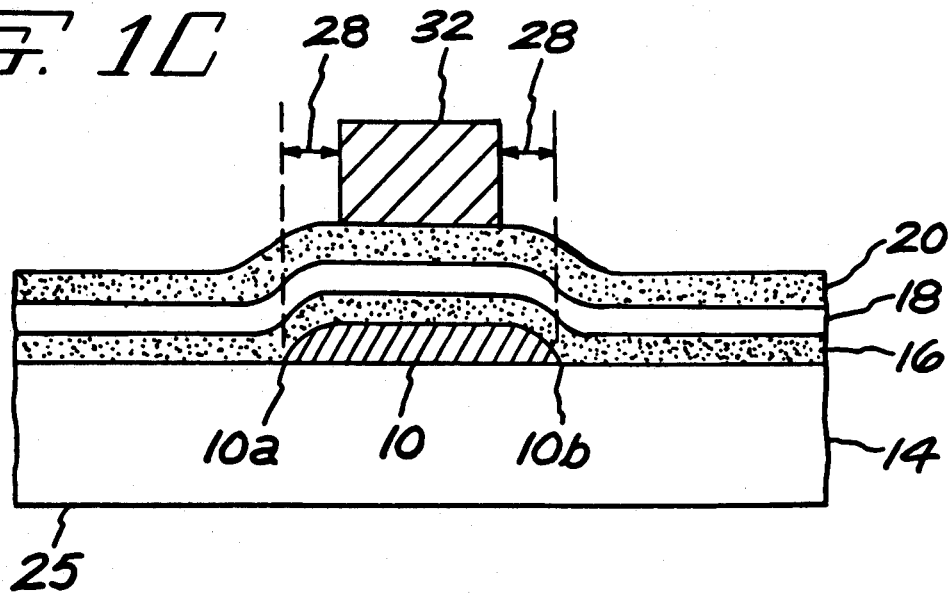

As seen in FIG. 1C, after UV exposure of photoresist layer 22, the exposed photoresist is developed and removed, to leave a remaining photoresist portion 32. The exposed photoresist may be overdeveloped, either in addition to the UV overexposure or alternatively thereto, to further reduce the width of the remaining photoresist portion 32 and to control selected overlap distance 28. Selected distance 28 is preferably about 1 micron to about 2 microns.

Figure 1D:
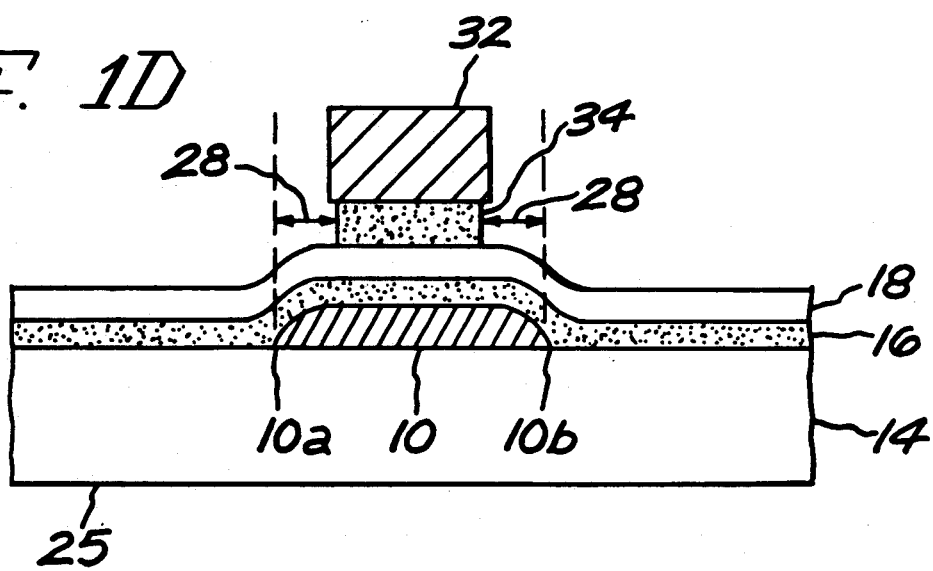

Referring now to FIG. 1D, those portions of second insulation layer 20 not masked by photoresist are removed by known etching techniques, after removing the exposed photoresist. If second insulation layer 20 is $SiN_x$ or $SiO_x$, it may be etched, for example, by buffered hydrofluoric acid (BHF) or hydrofluoric acid (HF). Second insulation layer 20 may, in accordance with the present invention, be over-etched to undercut remaining photoresist portion 32 to reduce the width of remaining second insulation segment 34 and to further control selected overlap distance 28. Selected distance 28 may then be controlled by the above described process variables, namely, (1) overexposure of the resist, (2) overdevelopment of the resist and (3) over-etching second insulation layer 20; these three process variables may be applied either individually or in combination to control selected distance 28. Remaining photoresist portion 32 is removed after second insulation layer 20 is etched.

In some applications, such as x-ray, optical or charged particle imagers or liquid crystal display (LCD) devices, it is desirable to pattern semiconductor layer 18 before the source/drain (S/D) metallization layer is deposited, to minimize the semiconductor material area under the S/D metallization and to provide additional area on the substrate for other components, such as pixel electrodes and the like. Semiconductor layer 18 may be patterned at this point in the fabrication process or after a doped semiconductor layer 36 is deposited, in which case both layers 18 and 36 will be etched in the same masking step; both of these alternative embodiments of the present invention will be described in more detail hereinafter.

Figure 1E:
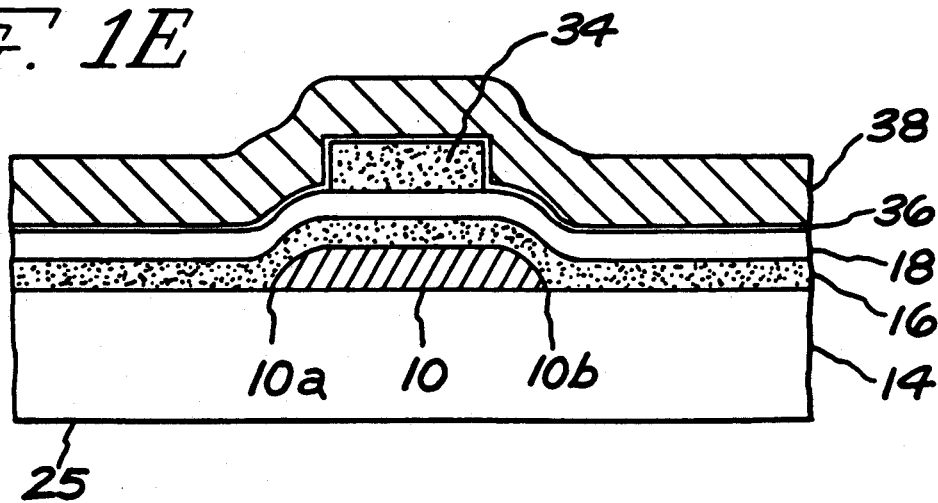

If it is not desirable or necessary to pattern semiconductor layer 18, a S/D metallization layer 38 is deposited over doped semiconductor layer 36 (FIG. 1E). Doped semiconductor layer 36 is preferably of n+ type conductivity, as provided by phosphorous doped amorphous silicon, and is deposited to a thickness between about 10 nm and about 50 nm. Layer 36 thus forms a contact between the S/D metallization layer 38 and underlying semiconductor layer 18. The S/D metallization may be a contact metal, such as molybdenum (Mo), chromium (Cr) and the like, deposited by sputtering or other known methods to a thickness between about 100 nm and about 500 nm.

Figure 1F:
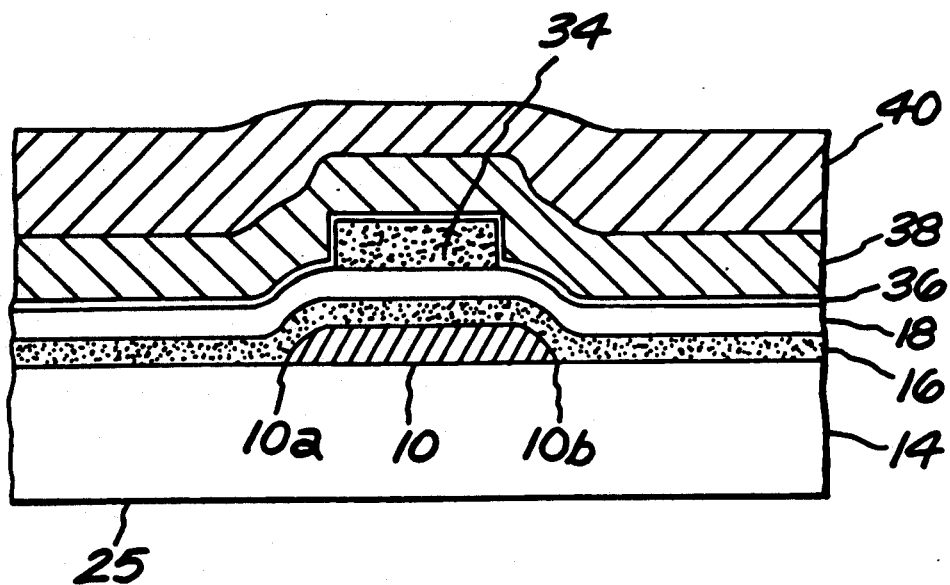
Figure 1G:
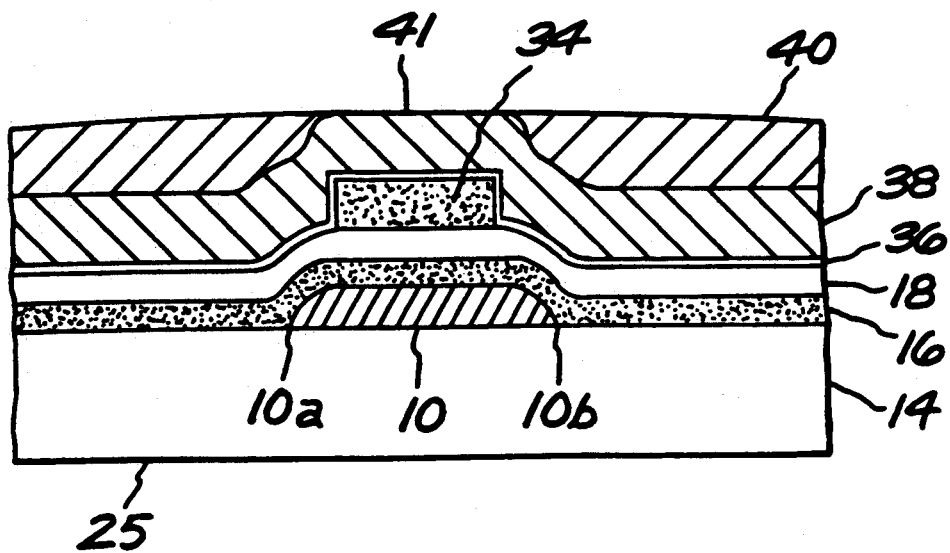
Figure 1H:
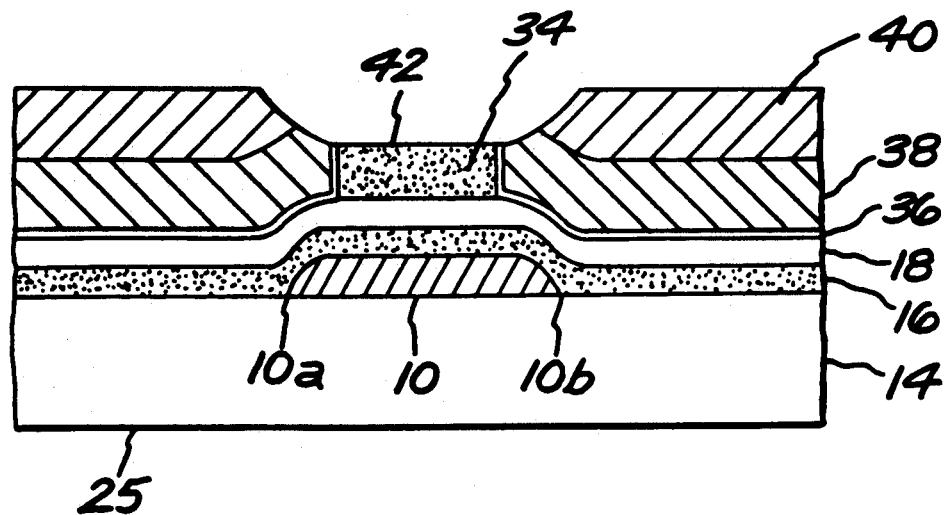
Figure 1I:
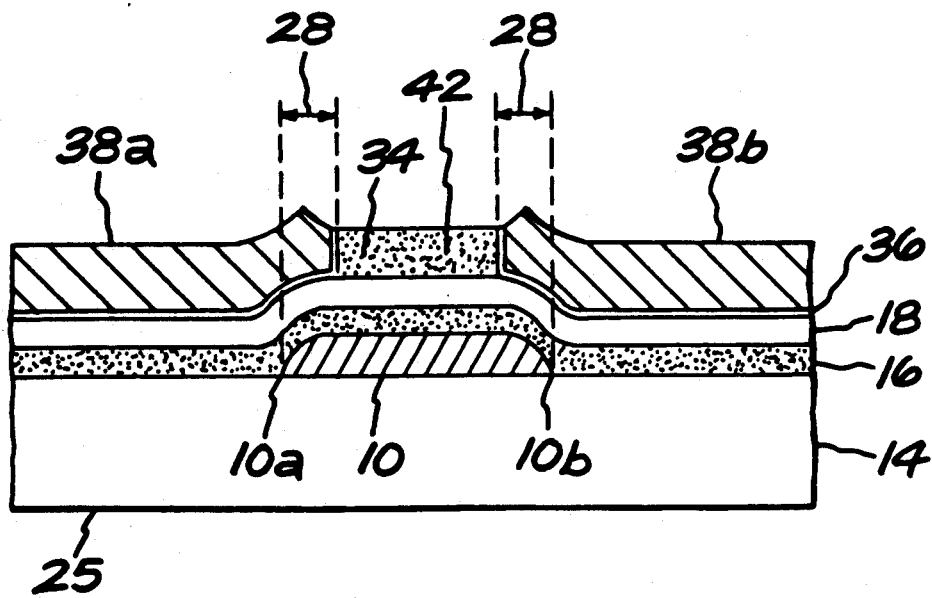

As shown in FIG. 1F and in accordance with another aspect of the present invention, a layer 40 of planarization material, such as photoresist material and the like, is deposited substantially completely over the entire wafer. Planarization layer 40 is then non-selectively etched back using a planarization etch, such as a reactive ion etch (RIE) or the like. In a presently preferred embodiment, planarization layer 40 is dry etched to expose a top portion 41 of S/D metallization layer 38 (FIG. 1G); exposed S/D metallization layer 38 and doped semiconductor layer 36 may then be selectively etched, using the patterned planarization layer as a mask, until a top portion 42 of remaining second insulation segment 34 is exposed (FIG. 1H). The remainder of planarization layer 40 may then be stripped (FIG. 1I). Etched layers 36 and 38 form self-registered source and drain electrodes 38a and 38b, which each respectively overlap gate electrode 10 by selected distance 28 (FIG. 1I); selected distance 28 is chosen to provide minimum S/D-G capacitance and acceptable contact resistance. S/D metallization layer 38 may be further patterned (not shown) subsequent to the step shown in FIG. 1I, or alternatively, layer 38 may be patterned prior to the deposition of planarization layer 40 (FIG. 1F), as desired according to the application of the FET device.

Since selected overlap distance 28 is preferably small to reduce S/D-to-gate capacitance, achieving a low contact resistance becomes a concern. An advantage of the method of the present invention is that semiconductor layer 18 can be made thin so that the voltage drop due to space charge limited current flow across semiconductor layer 18 is minimized; therefore, overlap distances less than about 1 micron should still provide low contact resistance and adequate FET performance.

Figure 2A:
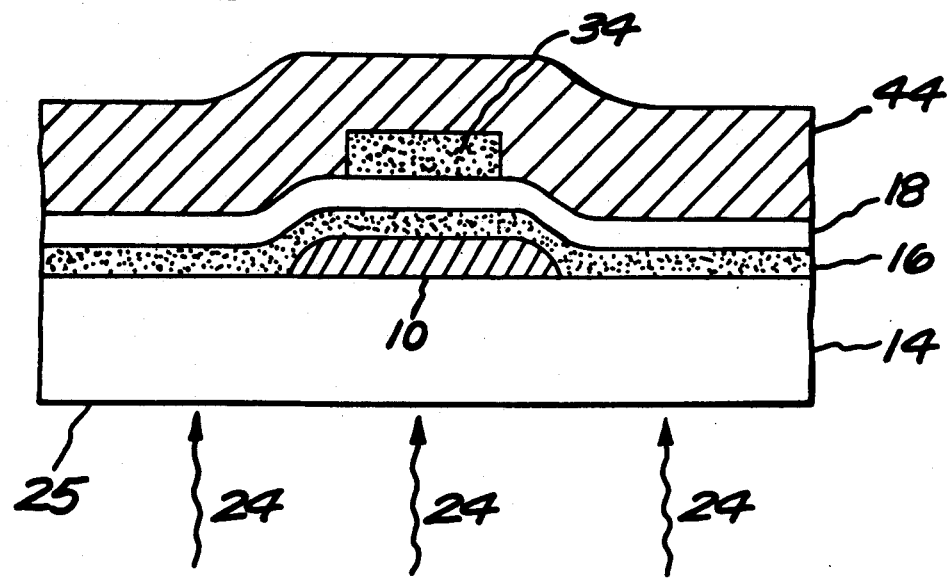
FIGS. 2A–2C are cross-sectional, side elevation views of the steps employed in the TFT fabrication method in accordance with another embodiment of the present invention.
Figure 2B:
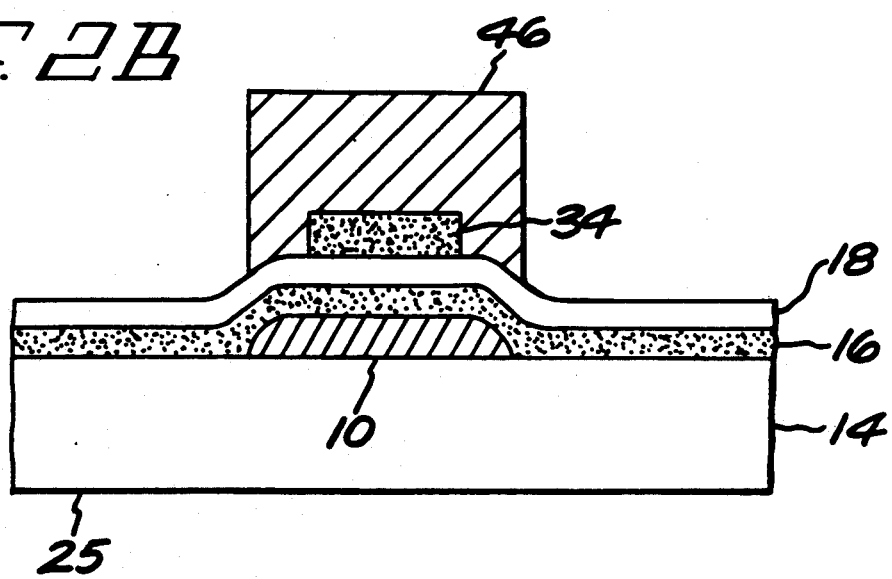

In accordance with an alternate embodiment of the present invention, after etching second insulation layer 20 (FIG. 1D), semiconductor layer 18 may be patterned to make room on the substrate for the formation of other devices and components, such as pixel electrodes and the like. Referring to FIG. 2A, a second layer 44 of photoresist material is deposited over semiconductor layer 18 and remaining second insulation segment 34. Substrate 14 is again exposed to UV light 24 on backside surface 25; the UV light passes through substrate 14 and layers 16 and 18 to expose second photoresist layer 44. Again, gate electrode 10 blocks some of the UV light so that only a portion of second photoresist layer 44 is exposed outside of an area corresponding substantially to gate electrode edges 10a and 10b. The exposed second photoresist layer portion is removed by developing the photoresist (FIG. 2B). The exposure time and development time of photoresist layer 44 is much less than the exposure and development time of photoresist layer 22 when second insulation layer 20 is patterned to form remaining photoresist portion 32 (FIG. 1C); the shorter exposure and development time produces a wider remaining photoresist portion 46 (FIG. 2B). Semiconductor layer 18 is then selectively etched, using remaining photoresist portion 46 as a mask, with a reactive ion etchant to minimize undercutting of the photoresist. Etching the semiconductor material not only provides additional area on the substrate surface, but also minimizes the semiconductor material or silicon under the S/D metallization which can trap carriers and increase lag and noise in devices such as imagers and the like.

Figure 2C:
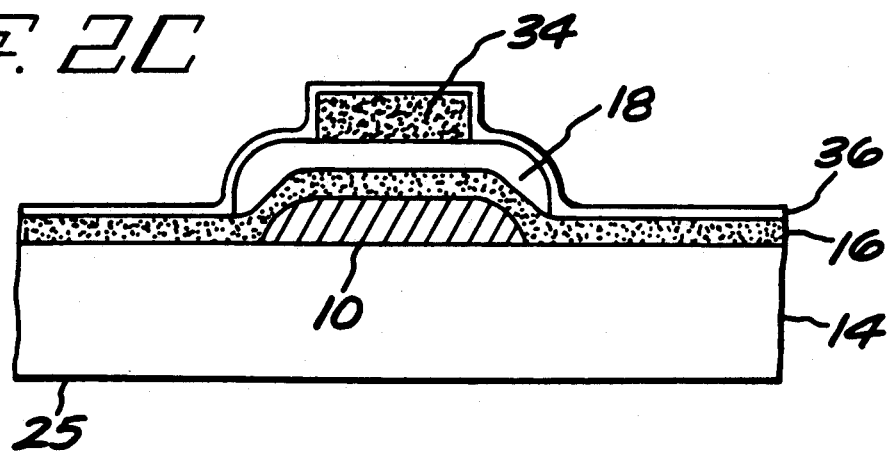

Photoresist portion 46 is removed and doped amorphous semiconductor layer 36 is deposited over remaining second insulation layer segment 34, patterned semiconductor layer 18 and on first insulation layer 16 (FIG. 2C). The fabrication process will then continue as described with respect to FIGS. 1E–1G.

Figure 3A:
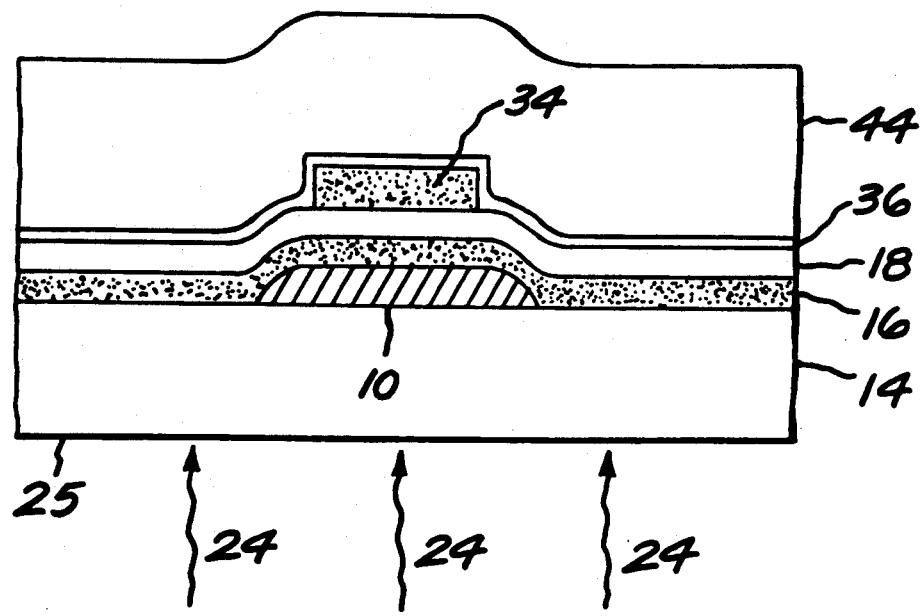
FIGS. 3A–3C are cross-sectional, side elevation views of the steps employed in the TFT fabrication
Figure 3B:
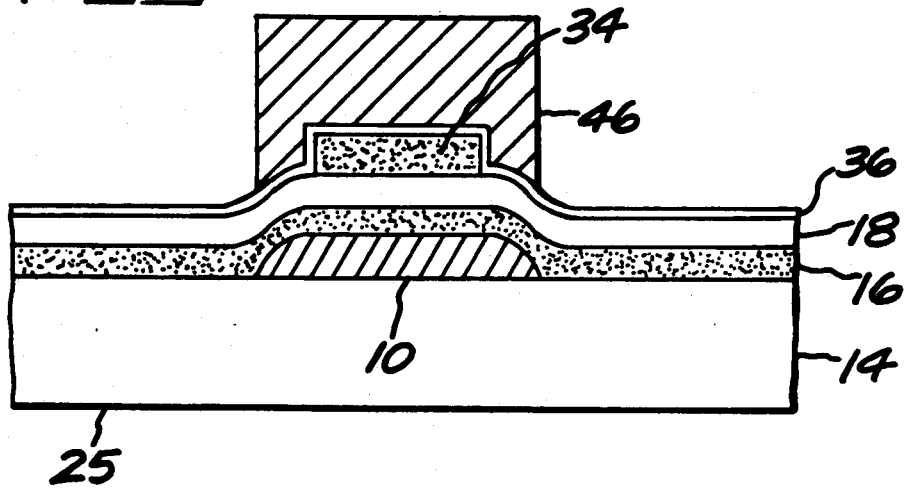
Figure 3C:
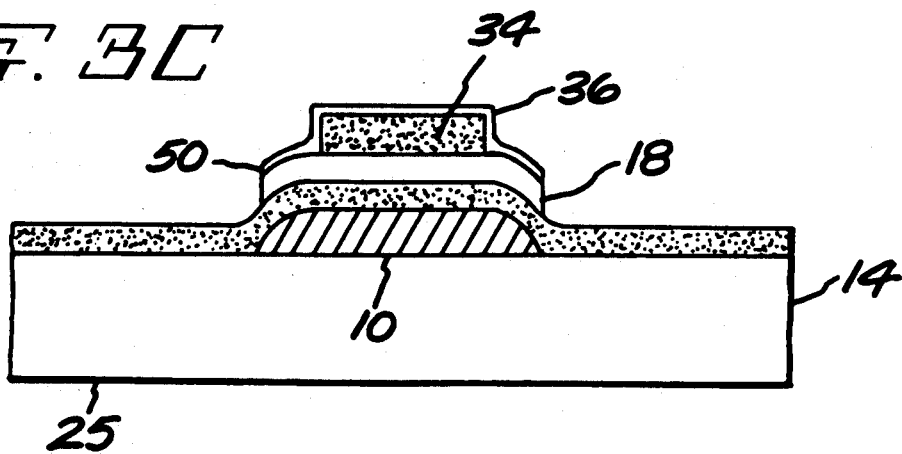

In a further embodiment of the present invention, as shown in FIG. 3A–3C, doped semiconductor layer 36 may be deposited over both remaining second insulation segment 34 and semiconductor layer 18, and both semiconductor layer 18 and layer 36 may be patterned (FIG. 3A). Second photoresist layer 44 is then deposited over doped semiconductor layer 36 and UV light 24 is directed on backside surface 25 of substrate 14 to expose portions of photoresist layer 44 that are not within the shadow of gate electrode 10. The UV exposure time and the development time of photoresist layer 44 should be less than the exposure and development time of photoresist layer 22 to provide a wider remaining resist portion 46 (FIG. 3B). Doped semiconductor layer 36 and amorphous semiconductor layer 18 are then etched to form an island structure 50 (FIG. 3C), which may be desirable for some applications to provide additional area on the substrate surface and to minimize the area of semiconductor material under conductive layer 38. The fabrication method would then proceed as discussed with respect to FIGS. 1E–1G.

Depositing doped semiconductor layer 36 after patterning amorphous semiconductor layer 18 (FIGS. 2A–2C) is presently preferred because formation of a metal-to-intrinsic-silicon contact near the channel region or active region of the FET could cause injection of minority carriers (holes) into the channel region and increased off current.

It will be readily understood by those skilled in the art that the present invention is not limited to the specific embodiment described and illustrated herein. Different embodiments and adaptations besides those shown herein and described, as well as many variations, modifications, and equivalent arrangements will now be apparent or will be reasonably suggested by the foregoing specification and drawings, without departing from the substance or scope of the invention. While the present invention has been described herein in detail in relation to its preferred embodiments, it is to be understood that this disclosure is only illustrative and exemplary of the present invention and is made merely for purposes of providing a full and enabling disclosure of the invention. Accordingly, it is intended that the invention be limited only by the spirit and scope of the claims appended hereto.

What is claimed is:

1. A method for fabricating a thin-film transistor, comprising the steps of:
   (a) forming an opaque gate electrode on a principal surface of a transparent substrate;
   (b) depositing a first layer of insulation material on the principal substrate surface over the gate electrode;
   (c) depositing a layer of semiconductor material on the first insulation layer;
   (d) depositing a second layer of insulation material on the semiconductor layer;
   (e) selectively etching the second insulation layer to leave a remaining second insulation segment and to expose a portion of the semiconductor layer not covered by the remaining second insulation segment, the remaining second insulation segment being aligned with the gate electrode and being narrower than the gate electrode by a selected overlap distance on each side thereof;
   (f) depositing a layer of doped semiconductor material on the exposed semiconductor portion and over the remaining second insulation segment;
   (g) depositing a layer of conductive material on the doped semiconductor material; and
   (h) selectively etching a portion of the conductive layer and a portion of the doped semiconductor layer to expose at least a top surface of the remaining second insulation segment and to form self-registered source and drain electrodes from the etched conductive layer which each overlap the gate electrode the selected overlap distance, said source and drain electrodes each terminating at said second insulation segment without overlap thereof.

2. The method of claim 1, wherein step (e) comprises the steps of:
   depositing a first layer of photoresist on the second insulation layer;
   exposing a back-side substrate surface, opposite to the principal substrate surface, to UV light for a selected duration, to cause exposure of at least a portion of the first photoresist layer substantially outside of a shadow of the gate electrode; and removing at least the exposed first photoresist portion by selective development, to form a mask for etching the second insulation layer.

3. The method of claim 1, wherein step (h) comprises the steps of:

depositing a planarization layer on the conductive layer; and nonselectively etching the planarization layer to expose a top surface of the conductive layer portion.

4. The method of claim 1 wherein said top surface of said second insulation segment exposed by the selective etching is contiguous with the top surface of the conductive layer.

5. A method for fabricating a thin-film transistor, comprising the steps of:

(a) forming an opaque gate electrode on a principal surface of a transparent substrate;

(b) depositing a first layer of insulation material on the principal substrate surface and over the gate electrode;

(c) depositing a layer of semiconductor material on the first insulation layer;

(d) depositing a second layer of insulation material on the semiconductor layer;

(e) depositing a first layer of photoresist on the second insulation layer;

(f) exposing a back-side substrate surface, opposite to the principal substrate surface, to UV light for a selected duration, to cause exposure of at least a portion of the first photoresist layer substantially outside of a shadow of the gate electrode;

(g) removing at least the exposed first photoresist portion by selective development, to leave a first remaining photoresist portion and to expose a segment of the second insulation layer not covered by the first remaining photoresist portion;

(h) selectively etching the second insulation layer segment to leave a remaining second insulation segment, under the first remaining photoresist portion, and to expose a portion of the semiconductor layer not covered by the remaining second insulation segment, the remaining second insulation segment being aligned with the gate electrode and being narrower than the gate electrode by a selected overlap distance on each side thereof;

(i) removing the first remaining photoresist portion;

(j) depositing a layer of doped semiconductor material on the exposed semiconductor portion and over the remaining second insulation segment;

(k) depositing a layer of conductive material on the doped semiconductor material;

(l) depositing a planarization layer on the conductive layer; and (m) etching the planarization layer, a portion of the conductive layer and a portion of the doped semiconductor layer, to expose at least a top surface of the remaining second insulation segment, and to form self-registered source and drain electrodes from the etched conductive layer, which each overlap the gate electrode the selected overlap distance.

6. The method of claim 4, wherein step (f) comprises the step of selecting the duration of UV exposure to cause the exposed photoresist portion to extend within the gate electrode, on each side thereof, by the selected overlap distance.

7. The method of claim 5, wherein step (g) comprises the step of selectively overdeveloping the exposed photoresist to cause the remaining photoresist portion to be shorter, on each side thereof, than the gate electrode by the selected overlap distance.

8. The method of claim 5, wherein step (h) comprises the step of selectively over-etching the second insulation layer segment to cause the remaining second insulation segment to be narrower than the gate electrode, on each side thereof, by the selected overlap distance.

9. The method of claim 5, wherein the selected overlap distance is a function of at least one of: the selected duration of step (f), the selective development of step (g) and the selective etching of step (h).

10. The method of claim 5, wherein the selected overlap distance is between about 1 and about 2 microns.

11. The method of claim 5, further comprising the step of patterning the semiconductor layer to form an island structure before steps (j) and (k).

12. The method of claim 11, further comprising the steps of:

depositing a second layer of photoresist on the exposed semiconductor portion and over the remaining second insulation segment;

exposing at least a portion of the second photoresist layer substantially outside of the gate electrode shadow;

removing the exposed second photoresist portion to leave a second remaining photoresist portion, and to expose a segment of the semiconductor layer not covered by the second remaining photoresist portion;

removing the exposed semiconductor segment to form the island structure; and removing the second remaining photoresist portion.

13. The method of claim 12, wherein the second remaining photoresist portion has a width wider than the first remaining photoresist portion.

14. The method of claim 12, wherein the second remaining photoresist portion has a width which corresponds substantially to the gate electrode.

15. The method of claim 5, further comprising the step of patterning the doped semiconductor layer and the semiconductor layer to form an island structure before step (k).

16. The method of claim 15, further comprising the steps of:

depositing a second layer of photoresist on the doped semiconductor layer;

exposing at least a portion of the second photoresist layer substantially outside of the gate electrode shadow;

removing the exposed second photoresist portion to leave a second remaining photoresist portion;

etching the doped semiconductor layer and the semiconductor layer using the second remaining photoresist portion as a mask to form the island structure; and removing the second remaining photoresist portion.

17. The method of claim 16, wherein the second remaining photoresist portion has a width wider than the first remaining photoresist portion.

18. The method of claim 16, wherein the second remaining photoresist portion has a width which corresponds substantially to the gate electrode.

19. The method of claim 5, wherein the semiconductor material is selected from the group consisting of intrinsic amorphous silicon, amorphous germanium and polycrystalline semiconductor material.

20. The method of claim 5, wherein the gate electrode is formed of at least one material selected from the group consisting of: titanium, chromium, tungsten, and aluminum.

21. The method of claim 20, wherein the gate electrode has a multilayer structure.

22. The method of claim 5, wherein the gate electrode has a thickness between about 100 nm and about 500 nm.

23. The method of claim 5, wherein the gate electrode has tapered edges to improve step coverage over gate electrode.

* * * * *